United States Patent [19]
Calabro

[11] Patent Number: 4,574,332
[45] Date of Patent: Mar. 4, 1986

[54] CAGE APPARATUS FOR PRINTED CIRCUIT BOARDS AND METHOD FOR PREVENTING SHARP SPIKES IN THE SIGNAL APPLIED TO SAID PRINTED CIRCUIT BOARDS

[76] Inventor: Anthony D. Calabro, UNITRACK Div., Calabro Industries, Inc., 1372 Enterprise Dr., West Chester, Pa. 19380

[21] Appl. No.: 508,827

[22] Filed: Jun. 29, 1983

[51] Int. Cl.$^4$ ............................................. H01R 23/68
[52] U.S. Cl. ..................................... 361/413; 361/412; 361/415
[58] Field of Search ........................ 361/412, 413, 415; 339/17 M

[56] References Cited

U.S. PATENT DOCUMENTS

| | | |
|---|---|---|
| 3,760,233 | 9/1973 | Warwick .............................. 361/415 |
| 4,079,440 | 3/1978 | Ohnuma et al. ................. 361/413 X |
| 4,158,220 | 6/1979 | Yamamotot et al. ............... 361/415 |
| 4,164,362 | 8/1979 | Doty et al. ..................... 361/415 X |
| 4,241,381 | 12/1980 | Taylor et al. .................... 361/415 X |
| 4,429,937 | 2/1984 | Stockmaster ................ 339/17 M X |

FOREIGN PATENT DOCUMENTS 3002050  7/1980  Fed. Rep. of Germany ... 339/17 M

Primary Examiner—R. R. Kucia
Attorney, Agent, or Firm—Anthony J. Casella; Gerald E. Hespos

[57] ABSTRACT

A cage apparatus for receiving printed circuit boards which permits an electrical potential to be directed across the printed circuit boards and a method for preventing the development of sharp spikes in the circuit signal applied to said printed circuit boards are provided. A first and second array of mounting guides are mounted in the cage apparatus to receive the printed circuit boards. The second array of mounting guides is electrically conductive and an electrical potential is directed across said second array. The printed circuit board is inserted in the cage apparatus and contacts the second array of mounting guides before a circuit signal is applied. Thus an electrical potential is directed across the printed circuit board which prevents the development of sharp spikes when the circuit signal is thereafter applied to said printed circuit board.

1 Claim, 4 Drawing Figures

CAGE APPARATUS FOR PRINTED CIRCUIT BOARDS AND METHOD FOR PREVENTING SHARP SPIKES IN THE SIGNAL APPLIED TO SAID PRINTED CIRCUIT BOARDS

BACKGROUND OF THE INVENTION

Printed circuit boards are usually mounted in an enclosure and connected to power supplies, panel controls, connectors and other circuitry. In a system where several circuit boards are required, one way to arrange the printed circuit boards is with a cage apparatus. The cage apparatus is generally composed of a rigid assembly with aligned guides to receive individual printed circuit boards, and aligned holes along the rear so that edge connectors can be mounted to mate with the boards. More particularly, the rigid assembly includes two side panels which are separated by several channel members connected along both the top and bottom of the side panels. Conventional card guides made from a dielectric material are connected between the channel members. The standard guides are similar to the guides shown in U.S. Pat. No. 4,019,099, issued to Anthony D. Calabro.

The prior art includes two broad classes of connectors for printed wiring assemblies. In the card edge, or one-part connector, the plug is printed on the end of the printed circuit board as part of the printed wiring. The second class of prior art connector is the two-part connector where the plug portion is formed separately and is mounted as another component on the printed circuit board. Appropriate receptacles are provided for the two types of connector plugs. Thus, the printed circuit board is not energized until its plug end is inserted in the corresponding edge connector or receptacle.

It is often desired to remove the individual printed circuit boards for repair or replacement. However, whether the one or two-part connector is used, problems may occur when the new or repaired board is reinserted into the connector. More specifically, as the printed circuit board is forced into the connector, sharp spikes in the electrical signal directed to the printed circuit board may develop, possibly causing malfunction or damage to the entire electrical system.

At present, in order to avoid the sharp spikes when reinserting a repaired circuit board, prior art cage assemblies are provided with a special zero-insertion force connector to receive either the printed or separate plug of the circuit board. The principal deficiencies of the zero-insertion force connectors are that they are very expensive and time consuming to operate. Alternatively, to prevent the signal spikes, it is always possible to electrically shut down the entire system. However, it is not always practical since this may cause added labor expenses for shut down and start up time, in addition to possible lost production time.

In view of the above, it is an object of the subject invention to provide a cage apparatus for receiving printed circuit boards which permits an electrical potential to be directed across the printed circuit board to preclude spikes in the electrical signal provided to the printed circuit board.

It is another object of the subject invention to provide a cage apparatus for receiving printed circuit boards which can be used to ground the printed circuit boards.

It is a further object of the subject invention to provide a cage apparatus for receiving printed circuit boards which can be used to supply electrical power to the printed circuit boards.

It is another object of the subject invention to provide a cage apparatus for receiving printed circuit boards which can be used to stabilize the voltage potential of the printed circuit boards.

It is an additional object of the subject invention to provide a method for preventing the development of sharp spikes in the signal applied to a printed circuit board inserted in a cage apparatus.

SUMMARY OF THE INVENTION

The subject invention provides a cage apparatus for receiving printed circuit boards and a method for preventing the development of sharp spikes in the signal applied to the printed circuit boards. The printed circuit boards have electrical contacts on opposed edges and a plug end. The cage apparatus is formed with two side end plate members interconnected by several elongated channel and flat members disposed along the top and bottom of the apparatus. A first set of mounting guides made of a dielectric material is mounted perpendicularly between the front and intermediate elongated members to support and maintain the circuit boards in spaced parallel relationship. A second set of circuit board mounting guides made of an electrically conductive material is mounted on an elongated flat member adjacent to the intermediate elongated member. The first and second set of guides are arranged in a colinear relationship. Along the rear of the cage apparatus, a plurality of multiple pin connectors to receive the plug end of the printed circuit board may be provided.

An electrical potential is directed across the second set of mounting guides which in turn establishes an electrical potential across the printed circuit board when the guide and the electrical contacts of the printed circuit board come in contact with each other. The second set of mounting guides is positioned at a distance far enough from the edge connectors so that the printed circuit board contacts the second set of guides before the plug end of the printed circuit board is received by the connector. Hence, owing to the fact that power is supplied to the printed circuit board before it contacts the electrically energized multiple pin connector, the development of sharp spikes in the electrical signal is thereby prevented.

In the method for preventing the development of sharp spikes an electrical potential is provided to the second set of mounting guides. The printed circuit board is engaged by a first mounting guide. Thereafter, the edge of the printed circuit board with the electrical contacts is engaged by a second mounting guide which causes an electrical potential to be directed across the printed circuit board before a signal is applied, thereby precluding the development of sharp spikes in the signal.

DETAILED DESCRIPTION OF THE PREFERRED EMBODIMENTS

Figure 1:
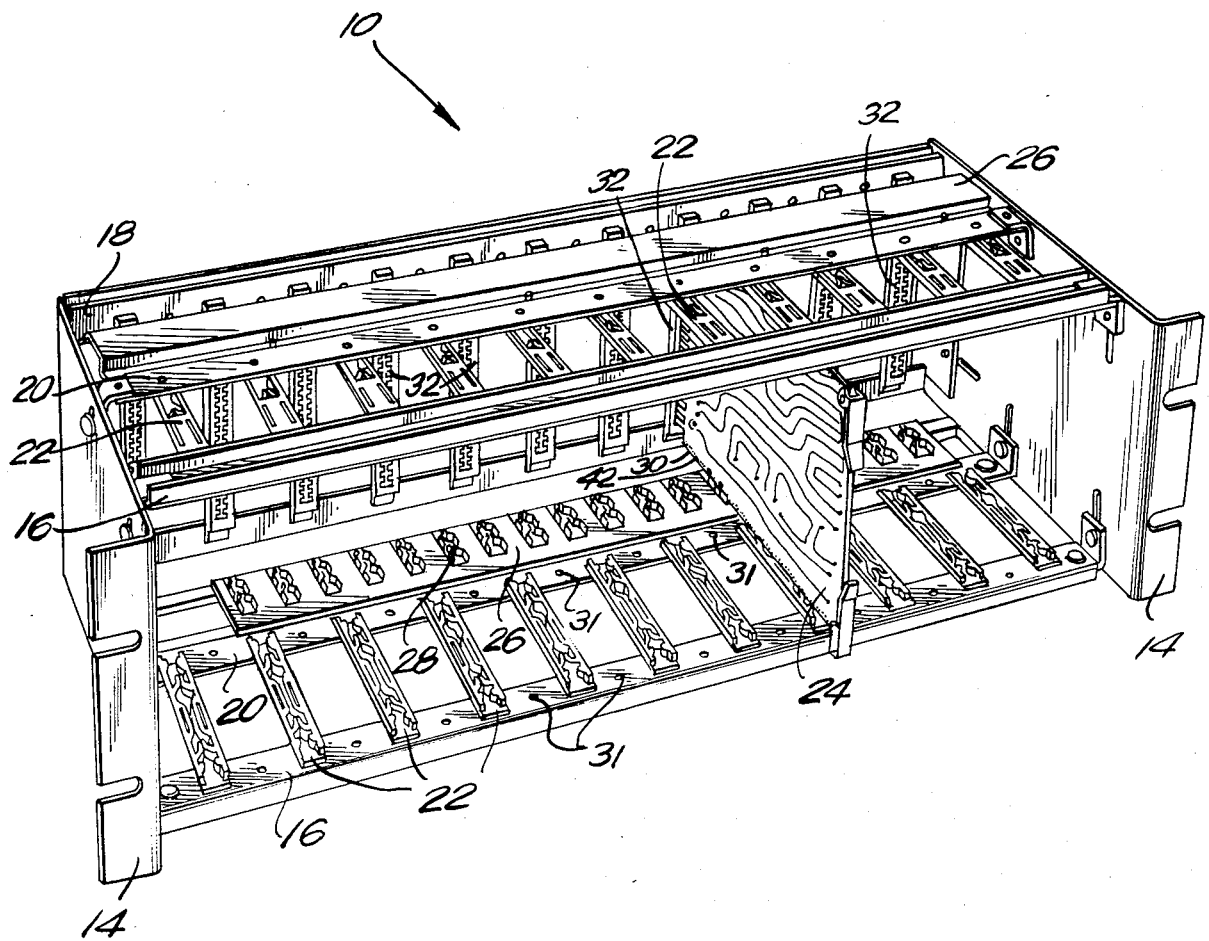
FIG. 1 is a perspective view of a cage apparatus for receiving printed circuit boards made according to the subject invention.
Figure 2:
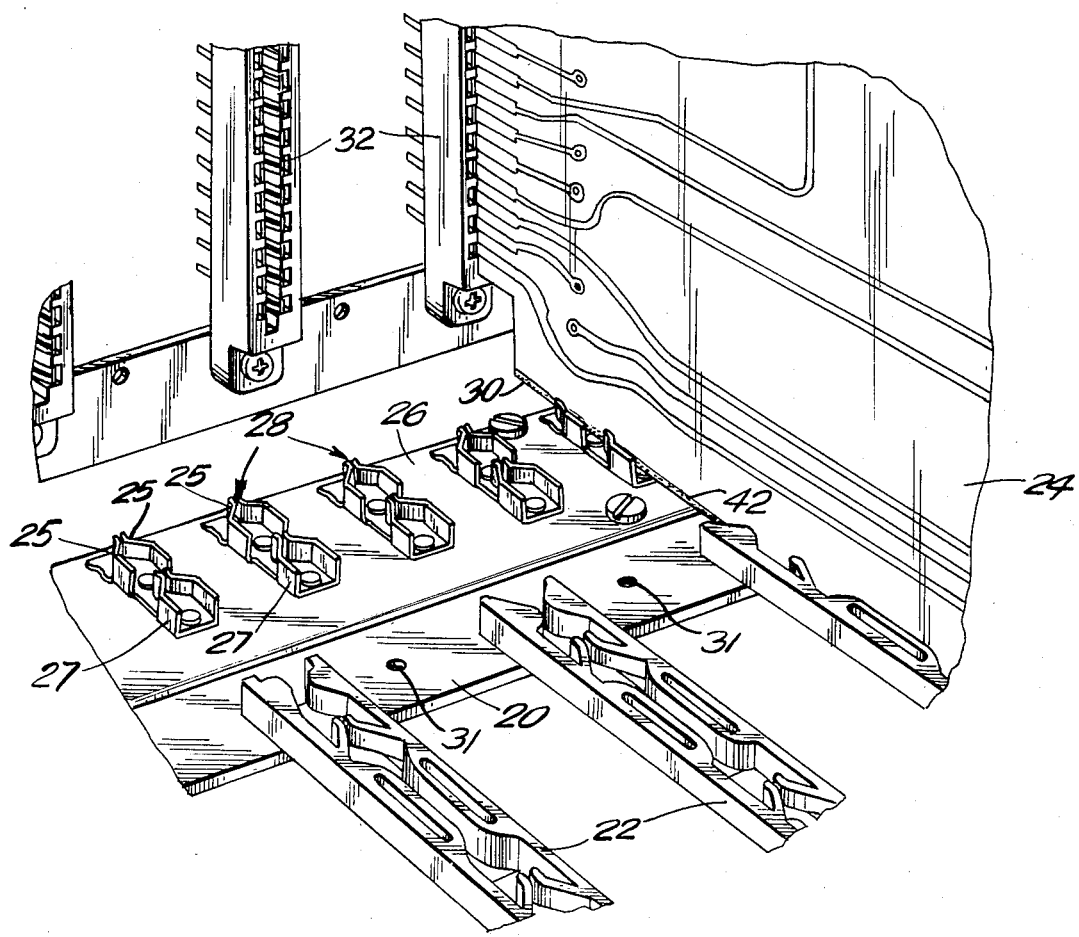
FIG. 2 is a detailed perspective view of the first and second array of printed circuit board engaging means with a printed circuit board mounted therein made according to the subject invention.

The cage apparatus 10 as shown in FIGS. 1 and 2 includes end plate members 14 interconnected by parallel spaced channel members 16 and 18. Channel members 16 are disposed substantially near the front, and channel members 18 are disposed substantially near the rear of cage apparatus 10. Flat members 20 are interconnected between end plates 14 and are disposed in a parallel spaced relationship between channel members 16 and 18. Channel members 16, 18 and flat members 20 define the top and bottom of cage apparatus 10. A plurality of first mounting guides 22 are interconnected between channel member 16 and flat member 20 in an array parallel to end plate members 14. First mounting guides 22 are made of a dielectric material such as plastic and are disposed along the top and bottom of cage apparatus 10 in order to hold a plurality of printed circuit boards 24 in a parallel array. Flat members 26 are interconnected between end plate members 14 adjacent to flat members 20. A plurality of second mounting guides 28 are mounted on flat members 26 in a spaced parallel array aligned linearly with the respective first mounting guides 22. Second mounting guides 28 are disposed along the top and bottom of cage apparatus 10 and are made of any electrical conductive material such as sheet metal or berylium copper. Each of second mounting guides 28 includes a plurality of opposed cantilevered spring fingers 25 and supporting walls 27 (see FIG. 3). Spring fingers 25 are spaced a sufficient distance to enable printed circuit board 24 to slide therebetween yet close enough to engage the bottom edge 30 of printed circuit board 24 (see FIG. 3). A plurality of multiple pin connectors 32 corresponding to the number of printed circuit boards are interconnected between channel members 18 in a spaced parallel relationship. Channel members 16, 18 and flat member 20 are provided with a plurality of spaced apertures 31 through which a suitable fastening means, such as screws or rivets, are extended to secure the corresponding members interconnected therebetween.

Figure 3:
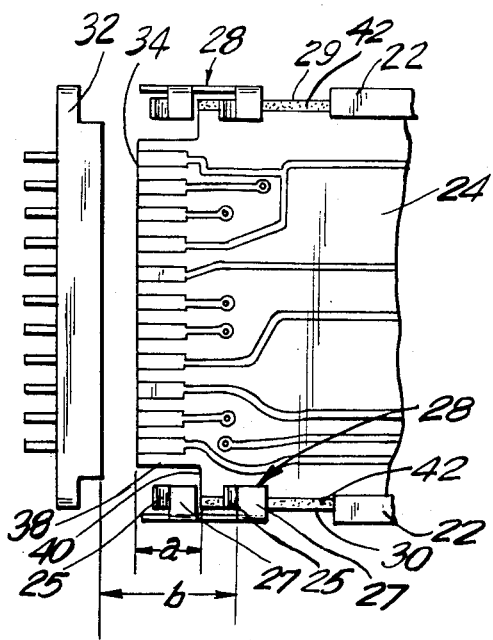
FIG. 3 is a plan view of a printed circuit board partially inserted in the cage apparatus made according to the subject invention.

As shown in FIG. 3, second mounting guides 28 are spaced apart from multiple pin connector 32 a sufficient distance so that upon insertion into cage apparatus 10, printed circuit board 24 will initially come in contact with first mounting guides 22, then second mounting guides 28 and then multiple pin connector 32, respectively. More particularly printed circuit board 24 has connector edge 34, top edge 29, and bottom edge 30. Cutouts defined by edges 38 and 40 are located at the corners between connector edge 34 and top and bottom edges 29, 30. Electrical strips 42 are provided on printed circuit board 24 along top and bottom edges 29, 30 and are engaged by spring fingers 25 of second mounting guides 28. Edge has a width "a". The distance between the multiple pin connector 32 and the spring finger 25 furthest from multiple pin connector 32 is indicated by the letter "b". Distance "b" must be greater than width "a" to insure that printed circuit board 24 contacts second mounting guide 28 before multiple pin connector 32.

Figure 4:
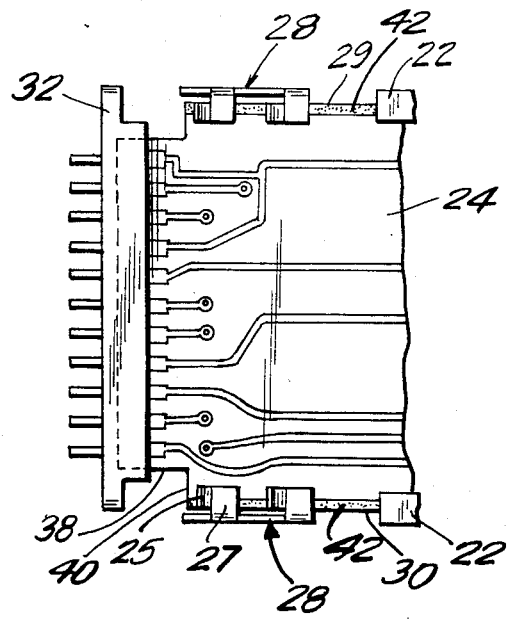
FIG. 4 is a plan view of a printed circuit board fully inserted in the cage appartus made according to the subject invention.

Therefore, according to the method of the subject invention, an electrical potential is provided across the second mounting guides 28. Printed circuit board 24 is inserted into cage apparatus 10 and top and bottom edges 29, 30 are first engaged by opposed first mounting guides 22. Preparatory to connector edge 34 of printed circuit board 24 being inserted into multiple pin connector 32 as shown in FIG. 4, electrical strips 42 are engaged by opposed second mounting guides 28 which causes an electrical potential to be directed across printed circuit board 24. Hence, printed circuit board 24 is provided with an electrical potential before connector edge 34 contacts multiple pin connector 32 which prevents the develop-ment of sharp spikes in the signal applied to printed circuit board 24 when connector edge 34 does contact electrically energized multiple pin connector 32. Thus the voltage potential across the printed circuit board 24 is stabilized. In addition, a ground may be connected to second mounting guides 28 which will provide protection for the devices mounted on printed circuit board 24.

In summary, a cage apparatus for receiving printed circuit boards and a method for preventing the development of sharp spikes in the signal applied to the printed circuit board are provided. The cage apparatus consists of end plate members interconnected by elongated members along the top and bottom of the cage apparatus. Disposed along the top and bottom of the cage apparatus are a first array of mounting guides for receiving and holding an array of printed circuit boards. A second array of mounting guides made of an electrically conductive material is linearly aligned with the first array, also along the top and bottom of the cage apparatus. The printed circuit boards utilized with the subject invention have electrical contacts on opposed edges which are engaged by opposed mounting guides from the second array and a plug end where a signal is applied. In the method according to the subject invention, an electrical potential is provided to the second array of mounting guides. A printed circuit board is inserted in the cage apparatus and received by opposed mounting guides from the first array. The electrical contacts of the printed circuit board are then engaged by opposed mounting guides from the second array which causes an electrical potential to be directed across the printed circuit board. Subsequently, the plug end of the printed circuit board is inserted into a multiple pin connector which will apply a circuit signal to the printed circuit boards. The multiple pin connector is mounted in the cage apparatus at a distance from the second array of mounting guides to insure that the printed circuit board contacts the second array of mounting guides before the plug end is inserted into the multiple pin connector. Thus, by first providing a voltage potential across the printed circuit board the development of sharp spikes when the circuit signal is applied to the printed circuit board is prevented.

While a preferred embodiment of the subject invention has been described and illustrated, it is obvious that various changes and modifications can be made therein without departing from the spirit of the present invention which should be limited only by the scope of the appended claims.

What is claimed:

1. A cage apparatus for receiving a plurality of printed circuit boards, each said printed circuit board being generally rectangular in configuration and including opposed top and bottom edges and a connector edge, said top and bottom edge being provided with electrically conductive strips attached thereto, said connector edge including a plurality of pin connector means for electrically joining each said circuit board to a multiple pin connector, said cage apparatus comprising:

- top and bottom supports disposed in spaced parallel relationship with the spacing therebetween being equal or slightly greater than the distance between the top and bottom edges of each said circuit board;
- spaced apart end plates connected to and extending between said top and bottom supports;
- a plurality of multiple pin connectors extending between and connected to said top and bottom supports, said multiple pin connectors being disposed in spaced parallel relationship to one another;
- a pair of dielectric mounting guides for each said multiple pin connector, the dielectric mounting guides in each said pair being mounted respectively to said top and bottom supports such that each said dielectric mounting guide is aligned with but spaced from its associated multiple pin connector, the spacing between the dielectric mounting guides in each said pair corresponding to the distance between the top and bottom edges of each said circuit board each said dielectric mounting guide including a plurality of spring fingers for biasingly engaging the associated circuit board and guiding the circuit board toward the associated multiple pin connector;
- a pair of electrically conductive mounting guides for each said multiple pin connector, the electrically conductive mounting guides in each said pair being aligned collinearly respectively with the dielectric mounting guides and being disposed intermediate one said dielectric mounting guide and the associated multiple pin connector, each said electrically conductive mounting guide including a plurality of spring fingers for biasingly engaging the electrically conductive strips of said circuit board, said spring fingers of said electrically conductive mounting guide being spaced from the associated multiple pin connector such that the electrically conductive strips must engage the electrically conductive mounting guides prior to the insertion of the circuit board into the multiple pin connector,
- means for providing an electrical signal to said multiple pin connectors; and
- means for providing an electrical signal to said multiple pin connectors; and
- means for providing a electrical potential across the electrically conductive mounting guides in each said pair, whereby the provision of the electrical potential across the mounting guides prior to insertion of each said circuit board into the corresponding multiple pin connector prevents sharp spikes in the electrical signal upon said insertion.

* * * * *